(12) United States Patent  (10) Patent No.: US 7,591,868 B2
Johnson                    (45) Date of Patent:     Sep. 22, 2009

(54) FILTER FOR ELECTRONIC ENCLOSURE

(75) Inventor: Christopher M. Johnson, Golden Valley, MN (US)

(73) Assignee: Donaldson Company, Inc., Minneapolis, MN (US)

( * ) Notice: Subject to any disclaimer, the term of this patent is extended or adjusted under 35 U.S.C. 154(b) by 707 days.

(21) Appl. No.: 10/960,482

(22) Filed: Oct. 7, 2004

(65) Prior Publication Data

US 2005/0166558 A1    Aug. 4, 2005

Related U.S. Application Data

(60) Provisional application No. 60/509,482, filed on Oct. 7, 2003.

(51) Int. Cl.
B01D 53/04 (2006.01)
G11B 33/14 (2006.01)

(52) U.S. Cl. ............... 55/385.6; 96/134; 96/135; 360/97.02; 454/184; 454/192

(58) Field of Classification Search ......... 55/385.6; 454/184, 192; 96/134, 135, 140, 142; 360/97.02
See application file for complete search history.

(56) References Cited

U.S. PATENT DOCUMENTS

| | | | |
|---|---|---|---|
| 4,617,122 A | 10/1986 | Kruse et al. |
| 4,863,499 A | 9/1989 | Osendorf |
| 5,030,260 A | 7/1991 | Beck et al. |
| 5,367,417 A | 11/1994 | Brown et al. |
| 5,391,426 A | 2/1995 | Wu |
| 5,417,743 A * | 5/1995 | Dauber ............. 96/13 |
| 5,538,545 A | 7/1996 | Dauber et al. |
| 5,593,482 A | 1/1997 | Dauber et al. |
| 5,869,009 A | 2/1999 | Bellefeuille et al. |
| 5,916,671 A | 6/1999 | Dauber et al. |
| 5,980,616 A | 11/1999 | Johnson et al. |
| 5,997,614 A | 12/1999 | Tuma et al. |
| 5,997,618 A | 12/1999 | Schneider et al. |
| 6,077,335 A | 6/2000 | Schneider et al. |
| 6,143,058 A | 11/2000 | Dahlgren et al. |
| 6,143,675 A | 11/2000 | McCollam et al. |
| 6,146,446 A | 11/2000 | Tuma et al. |
| 6,168,651 B1 | 1/2001 | Tuma et al. |
| 6,168,681 B1 | 1/2001 | Bellefeuille et al. |
| 6,196,708 B1 | 3/2001 | Rogers |
| 6,214,070 B1 | 4/2001 | Crowder et al. |
| 6,214,095 B1 | 4/2001 | Logan et al. |
| 6,238,467 B1 | 5/2001 | Azarian et al. |
| 6,296,691 B1 | 10/2001 | Gidumal |
| 6,395,073 B1 | 5/2002 | Dauber et al. |
| 6,475,270 B1 * | 11/2002 | Graeve ............. 96/135 |

(Continued)

*Primary Examiner*—Duane Smith
*Assistant Examiner*—Minh-Chau T Pham
(74) *Attorney, Agent, or Firm*—Pauly, DeVries, Smith & Deffner, L.L.C.

(57) ABSTRACT

A filter including a base portion along with a flange extending from the base and a top surface plus a bottom surface is disclosed. The filter also includes an outlet. During use the filter is placed within an electronic enclosure, generally with the bottom surface in contact with the wall of the enclosure. The wall of the enclosure has an inlet through which gases can travel into the interior of the filter, and then eventually leaving the filter by way of the outlet, which is within the interior of the electronic enclosure.

3 Claims, 1 Drawing Sheet

U.S. PATENT DOCUMENTS

| | | |
|---|---|---|
| 6,491,741 B2 | 12/2002 | Tuma et al. |
| 6,582,113 B2 | 6/2003 | Rogers |
| 6,709,498 B2 | 3/2004 | Tuma |
| 6,726,745 B2 | 4/2004 | Tuma et al. |
| 6,926,761 B2 | 8/2005 | Johnson et al. |
| 6,936,093 B2 | 8/2005 | Isogawa et al. |
| 7,095,584 B2 | 8/2006 | Logan |
| 7,125,433 B2 * | 10/2006 | Garikipati et al. .......... 55/385.6 |
| 7,166,142 B2 | 1/2007 | Tuma et al. |
| 7,211,124 B2 | 5/2007 | Gieseke et al. |
| 2001/0000381 A1 | 4/2001 | Tuma et al. |
| 2002/0063990 A1 | 5/2002 | Hirasaka et al. |
| 2002/0089781 A1 * | 7/2002 | Tuma ...................... 360/97.02 |
| 2003/0047078 A1 | 3/2003 | Ueki et al. |
| 2003/0056653 A1 | 3/2003 | Ueki et al. |
| 2003/0151847 A1 | 8/2003 | Tsang et al. |
| 2004/0114273 A1 | 6/2004 | Fujiwara et al. |
| 2004/0231518 A1 | 11/2004 | Johnson et al. |
| 2005/0047001 A1 | 3/2005 | Logan |
| 2005/0063093 A1 | 3/2005 | Hong et al. |

* cited by examiner

FILTER FOR ELECTRONIC ENCLOSURE

REFERENCE TO PRIORITY APPLICATION

This application claims the benefit of provisional application 60/509,482 filed Oct. 7, 2003 entitled FILTER FOR ELECTRONIC ENCLOSURE.

SUMMARY OF THE INVENTION

The present invention is directed to an improved filter for use in an electronic enclosure. The filter includes a diffusion channel positioned on the interior of the enclosure in fluid communication with the interior of the enclosure as well as with filter media, typically activated carbon. The diffusion channel is positioned intermediate the electronic enclosure and the filter media so that gases travel from the filter media through the diffusion channel and then into the enclosure, or gases travel from the interior of the enclosure through the diffusion channel and then into the media. One benefit of the present invention is that it restricts the amount of water that enters the drive enclosure.

In one implementation the diffusion channel is formed in a flange around the edge of a housing forming the filter. The flange can be cast such that it contains a depression for forming the diffusion channel, which is completed by placing an impermeable layer over the top of the channel.

FIGURES

The invention may be more completely understood in connection with the following drawings, in which.

DETAILED DESCRIPTION

Figure 1:
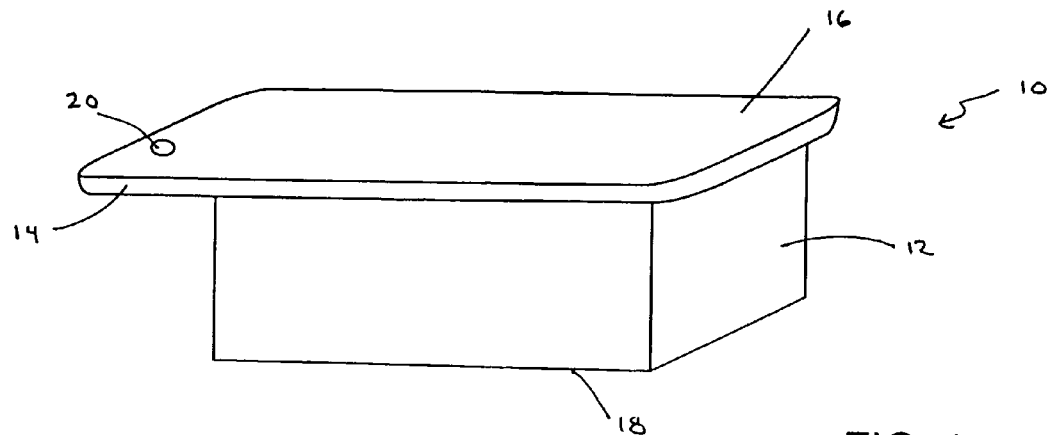
FIG. 1 is a top perspective view of a filter assembly made in accordance with an implementation of the invention.

In reference to FIG. 1, a perspective view of a filter made in accordance with an implementation of the invention is shown. The filter 10 includes a base portion 12 (typically formed by injection molding, along with a flange 14 extending from the base 12 and a top surface 16 plus a bottom surface 18. The filter 10 also includes an outlet 20. During use the filter 10 is placed within an electronic enclosure, generally with the bottom surface 18 in contact with the wall of the enclosure. The wall of the enclosure has an inlet (not shown) through which gases can travel into the interior of the filter 10, and then eventually leaving the filter 10 by way of outlet 20, which is within the interior of the electronic enclosure. Thus, the filter 10 works to prevent contaminants from entering the electronic enclosure.

Figure 2:
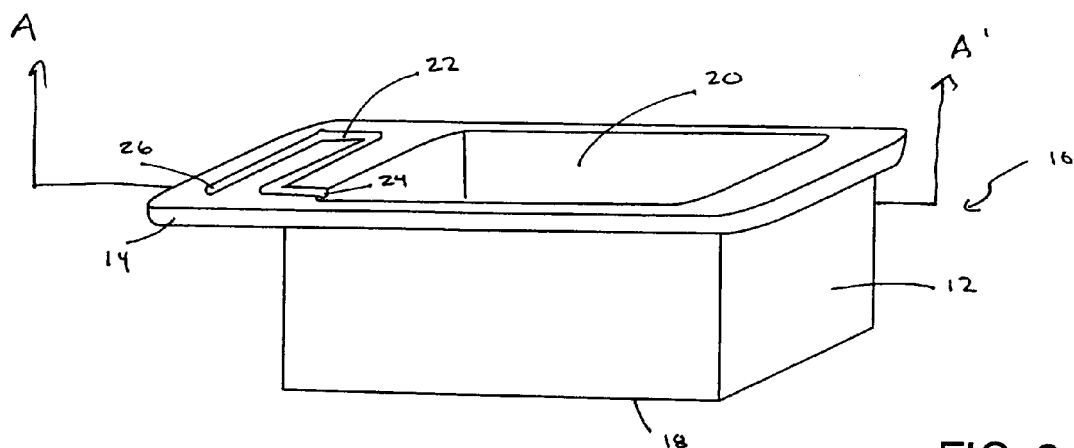
FIG. 2 is a top perspective view of a base portion of a filter assembly constructed in accordance with an implementation of the invention.

In reference now to FIG. 2, the filter 10 of FIG. 1 is shown with a top film removed from the top surface 16, exposing the interior 20 of the filter base portion 12. This interior 20 is generally configured so as to retain an adsorbent material, such as activated carbon (not shown). The filter 10 also includes a diffusion channel 22 constructed in the flange 14 of the base 12, the diffusion channel providing fluid communication between the interior 20 of the filter 10 and the hole 20 of the filter. The diffusion channel 22 is typically a tortuous path configured so as to slow the rate of diffusion of contaminants between the interior 20 of the filter 10 and the interior of the enclosure. The diffusion channel depicted in this embodiment has a first end 24 and a second end 26. The first end 24 is open to the interior 20 of the filter while the second end 26 is aligned with the outlet 20.

Figure 3:
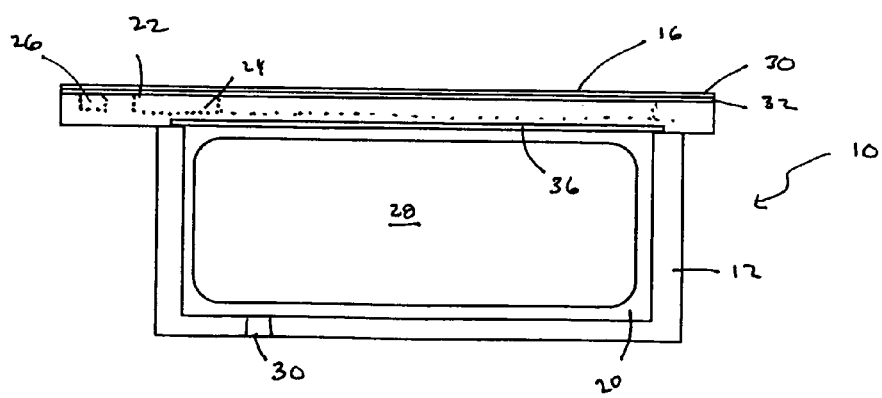
FIG. 3 is side cut-away view of the filter assembly of FIG. 1 taken along lines A-A' as shown in FIG. 2.

In reference to FIG. 3, a cross section of filter shown in FIG. 1 taken along plane A-A' is depicted, again showing the filter 10, body 12, and interior 20 of the body 12. An adsorbent 28 is also depicted. This figure shows one way of making the diffusion channel 22 by first forming a depression and then covering the top of the depression with an impermeable material, such as a sheet of Mylar. Referring to FIG. 3, an example of an impermeable layer 30 is depicted, along with an adhesive layer 32 to secure the impermeable layer 30 to the flange 14 of the filter 10. In addition, FIG. 3 Shows filter media 36 used to remove particulate contaminants. In some implementations a further impermeable layer can be included between the adhesive layer 32 and the filter media 36 so as to prevent the adhesive layer 32 from adhering to the filter media. However, in the alternative the adhesive layer can be die-cut or otherwise cut so that adhesive is selectively positioned around only the exterior of the flange 14.

Diffusion channels as used in the present invention may take on many different shapes and may be formed in many different ways. One shape for a diffusion channel is a semi-circular pattern. Alternately, a diffusion channel may be substantially straight. The channel may also be formed to have a more complex path, such as a winding path or a spiral path. The channel may, in some embodiments, have two or more branches. One skilled in the art will appreciate that there are many different diffusion channel patterns that are possible without deviating from the spirit of the invention.

The diffusion channel may be formed with the housing (e.g., molded or compression molded) or may be later formed in the housing by cutting or otherwise removing material from the housing. In some embodiments the channel could be internal, and thus molded within the plastic. Alternatively, separate diffusion channel layers, with a diffusion channel defined therein, may be formed as separate pieces and inserted into the interior of the housing or attached, for example, adhesively, to the exterior of the housing. This separate piece may be, for example, a molded article or a polymer film having a channel formed therein. The channel can be formed, for example, by removing a portion of the channel layer. The portion of the channel layer can be, for example, die-cut or otherwise removed using, for example, a stamping apparatus or a rotary press.

Such channels have a thickness that typically corresponds to the combined thickness of the channel layer and any adhesives used for attachment. The width of the channel can vary over a wide range. The width of the channel ranges from, for example, 1 mm to 10 mm, although wider or narrower channels may be used. In some embodiments, the width of the channel ranges from 1.5 to 5 mm. The width and thickness of the channel may be chosen to balance the pressure drop of the filter 100 between the channel and the filter media, although this is not necessary to the invention.

It will be understood that adsorbent filter material used in accordance with the invention includes materials that adsorb and/or absorb contaminants through physisorption and/or chemisorption. The adsorbent material can include physisorbents and/or chemisorbents, such as desiccants (i.e., materials that adsorb or absorb water or water vapor) and/or materials that adsorb volatile organic compounds and/or acid gas. The adsorbent material may include a single type of material or a combination of materials. Examples of suitable adsorbent materials include, for example, activated carbon, activated alumina, molecular sieves, silica gels, desiccating materials, potassium permanganate, calcium carbonate, potassium carbonate, sodium carbonate, calcium sulfate, or mixtures thereof. The adsorbent material may be in the form of, for example, particles, gels, sheets, webs, tablets, molded articles, or liquids, that are, preferably, held in place within the filter.

The adsorbent material may remove a single contaminant or a number of contaminants. Examples of contaminants that may be removed include, for example, water, water vapor, chlorine, hydrogen sulfide, HCl, nitrogen dioxide, acid gases, volatile organic compounds, and hydrocarbon compounds.

For typical operation, an adsorbent material that is stable and adsorbs within a temperature range of −40° C. to 100° C. is preferred. Preferably, the adsorbent material is a powder (passes through 100 mesh U.S.S.) or granular material (28 to 200 mesh) prior to forming the adsorbent layer.

In some implementations, the adsorbent material is combined with a binder material. The binder is typically dry, powdered, and/or granular and is mixed with the adsorbent. In some embodiments, the binder and adsorbent material are mixed using a temporary liquid binder and then dried. Typically, a binder is used that does not completely coat the adsorbent material. Suitable binders include, for example, microcrystalline cellulose, polyvinyl alcohol, starch, carboxyl methylcellulose, polyvinylpyrrolidone, dicalcium phosphate dihydrate, sodium silicate, latex and polytetrafluoroethylene.

The composition of the adsorbent layer can include for example at least about 70%, by weight, and typically not more than about 98%, by weight, adsorbent. In some instances, the adsorbent layer includes 85 to 95%, preferably, approximately 90%, by weight, adsorbent. The adsorbent layer typically includes not less than about 2%, by weight, binder and not more than about 30%, by weight, binder. In some instances, the adsorbent layer includes about 5 to 15%, and, preferably, about 10%, by weight, binder.

In some instances, where the adsorbent layer is molded, it may be desirable to include a small amount of lubricant such as PTFE (Teflon® powder) within the composition, in order to facilitate mold release. When PTFE is used, preferably no more than about 10%, and more preferably less than about 3% of the composition, comprises added lubricant. If a lubricant is used, preferably a minimum amount effective to accomplish a desirably reproducible mold release is used.

The adsorbent layer may be supported by one or more support layers, such as a support scrim. Examples of such support layers include woven and non-woven films/fabrics made from, for example, stretched or sintered plastics, such as polyesters, polypropylene, polyethylene, and polyamides (e.g., nylon). In some embodiments, the support layer may be porous and permit substantial cross-flow of fluid across the support layer and into other portions of the filter media.

I claim:

1. A filter assembly for use in an electric enclosure, the filter assembly comprising:
    a body configured for receiving an adsorbent material;
    an opening in the body configured to receive the adsorbent material, the opening containing a flange for securing an impermeable material over the opening;
    a diffusion channel positioned within the flange; said diffusion channel configured to provide gaseous communication between the interior of the electronic enclosure and adsorbent material positioned within the body.

2. The filter assembly of claim 1, wherein the body comprises an injection molded material.

3. The filter assembly of claim 2, wherein the adsorbent material comprises activated carbon.

* * * * *